(12) United States Patent
Ju et al.

(10) Patent No.: US 7,166,997 B2
(45) Date of Patent: Jan. 23, 2007

(54) COMPLEX TRANSVERSE AC MAGNETO-OPTIC SUSCEPTOMETER FOR DETERMINATION OF VOLUME AND ANISOTROPY FIELD DISTRIBUTION IN RECORDING MEDIA

(75) Inventors: Ganping Ju, Wexford, PA (US); Roy W. Chantrell, Pittsburgh, PA (US); Hong Zhou, Pittsburgh, PA (US); Dieter K. Weller, Gibsonia, PA (US)

(73) Assignee: Seagate Technology LLC, Scotts Valley, CA (US)

(*) Notice: Subject to any disclaimer, the term of this patent is extended or adjusted under 35 U.S.C. 154(b) by 248 days.

(21) Appl. No.: 10/679,905

(22) Filed: Oct. 6, 2003

(65) Prior Publication Data
US 2004/0066190 A1 Apr. 8, 2004

Related U.S. Application Data

(60) Provisional application No. 60/416,639, filed on Oct. 7, 2002.

(51) Int. Cl.
*G01R 33/02* (2006.01)
(52) U.S. Cl. .................................. 324/244.1
(58) Field of Classification Search ............. 324/244.1, 324/210, 201, 202, 211, 212, 228–233, 244, 324/260; 359/258, 280
See application file for complete search history.

(56) References Cited

U.S. PATENT DOCUMENTS 4,134,064 A * 1/1979 Jacobs et al. ............... 324/201
5,212,446 A * 5/1993 Itoh et al. .................. 324/244.1
5,311,125 A 5/1994 Krause et al.
5,506,500 A 4/1996 Krause et al.
5,600,241 A 2/1997 Jacobsen, Jr. et al.
5,631,559 A 5/1997 Oliver et al.
5,736,856 A 4/1998 Oliver et al.
6,501,269 B1 12/2002 Vajda
6,566,872 B1 * 5/2003 Sugitani ..................... 324/249

OTHER PUBLICATIONS

C. Papusoi, Jr., "The complex transverse susceptibility", Physics Letters A, vol. 265, pp. 391-402, Feb. 7, 2000.*
Magneto-Optical Kerr Effect, Thin Films magnetic Research, http://web.archive.org/web/20011006162738/http://www-users.york.ac.uk/~phys18/MOKE.htm, Dated Oct. 6, 2001, 3 pages (includes a page from the Internet Archive Wayback Machine showing the Oct. 6, 2001 date of publication).*
AC-Susceptibility Measurements in Small Fields on Fine Superparamagnetic Nickel Particles, Soffge et al., Z. Phys. B—Condensed Matter, vol. 42, p. 47-55 (1981).*

(Continued)

*Primary Examiner*—Edward Lefkowitz
*Assistant Examiner*—David M. Schindler
(74) *Attorney, Agent, or Firm*—Kinney & Lange, PA (57) ABSTRACT

A method and apparatus for determining volume and anisotropy field distribution of thin film granular material includes the use of a magneto-optic probe, a lock-in amplifier, and a computer. The magneto-optic probe utilizes the Kerr effect in order to determine the transverse AC susceptibility of the sample. The Lock-in amplifier determines the complex parameters of the susceptibility as a function of the DC field and AC frequency. Separate distribution values of anisotropy field and grain volume can then be determined mathematically from the relationship of complex susceptibility parameters to the DC field strength.

49 Claims, 6 Drawing Sheets

OTHER PUBLICATIONS

C. Papusio Jr, et al., "Anisotropy field distribution measurements for high-density recording media", Journal of Magnetism and Magnetic Materials 240, (2002), 568-570.

"LakeShore Series 7225 AC susceptometer and DC magnetometer", Competence & Facilities, www.risoe.dk/afm/external/asab/AC$_{13}$ susceptometer_DC_magnetometer.htm, 1-2.

Dynamic study of dipole—dipole interaction effects in a magnetic nanoparticle system, Physical Review B, vol. 57, No. 1, Jan. 1998, 497-504.

David Thompson, Hard-drive makers push fundamental limits, http://www.eetimes.com/at/news/, Jun. 30, 2000, 1-5.

J.A. Corrales, et al., "Highly sensitive magneto-optic transverse Kerr effect measurement system for the detection of perpendicular anisotropy and magnetic phases in thin films", J. Appl. Phys. 79(8), Apr. 15, 1996 5217-5219.

"IBM's New Magnetic Hard-Disk-Drive Media Delays Superparamagnetic Effects", IBM Research News, www.research.ibm.com/resources/news, 1-4.

C. Papusoi, Jr., et al., "Magnetic Anisotropy Field Disperson Characterization of Advanced Perpendicular and Longitudinal Media", IEEE Transactions on Magnetics, Vo. 38, No. 4, Jul. 2002, 1687-1692.

Magnetic Disk Drive Technology Status, http://www.wtec.org/loyola/hdmem/02_03. htm, 1-3.

A. Berger, et al., "Magneto-optical Kerr effect study of ac susceptibilites in ultrathin cobalt films", J. Appl. Phys. 75(10), May 15, 1994 http://ojps.aip.org/japo/jacr.jsp, 5598-5600.

C.S. Arnold, et al., "Magnetic susceptibility measurements of ultrathin films using the surface magneto-optic Kerr effect: Optimization of the signal-to-noise ratio, Rev. Sci. Instrum." 68(11), Nov. 1997, 4212-4216.

Ganping Ju, "Measurement of perpendicular media anisotropy field with accurate demagnetization correction", Journal of Applied Physics, vol. 93, No. 10, May 15, 2003, 7846-7848.

Mary F. Doerner, et al., "Microstructure and Thermal Stability of Advanced Longitudinal Media", IEEE Transactions on Magnetics, vol. 36, No. 1, Jan. 2000, 43-47.

M. Mallary, et al., "One Terabit per Square Inch Perpendicular Recording Conceptual Design", IEEE Transactions on Magnetics, vol. 38, No. 4, Jul. 2002, 1719-1724.

"Patterned Media & Patterned Media-Like Storage Media for Ultrahi Magnetic Recording", Research, http://www.dsi.a-star.edu.sg/tracks/media/research/Patterned%20Media.html, 1-4.

Lake Shore 7000 Series System User's Manual, 1-13.

* cited by examiner

COMPLEX TRANSVERSE AC MAGNETO-OPTIC SUSCEPTOMETER FOR DETERMINATION OF VOLUME AND ANISOTROPY FIELD DISTRIBUTION IN RECORDING MEDIA

CROSS-REFERENCE TO RELATED APPLICATION(S)

This application claims priority from Provisional Application No. 60/416,639, filed Oct. 7, 2002 for "Highly sensitive complex transverse AC susceptometer using magneto-optical probe for accurate determination of volume and anisotropy field distribution in recording media" by G. Ju, R. Chantrell, H. Zhou, and D. Weller, which is incorporated by reference.

BACKGROUND OF THE INVENTION

The present invention relates generally to methods used to determine magnetic properties of materials. In particular, this invention relates to systems that determine the grain size distribution, $\sigma_V$, and anisotropy field distribution, $\sigma_{HK}$, in thin film granular or nanoparticle material.

In order to achieve magnetic recording in advanced perpendicular media beyond 100 Gbits/in$^2$, it is necessary to have media with ultra-high anisotropy constant, $K_U$, and very narrow anisotropy field distribution, $\sigma_{HK}$. Increases in areal density of the recording media have relied on a reduction of the magnetic grain size, V (where V is volume), and the grain size distribution, $\sigma_V$ to keep media noise within acceptable levels while at the same time maintaining thermal stability. To achieve this goal, the media must be carefully designed and engineered to reduce both the grain size, V, and anisotropy field distribution, $\sigma_{HK}$.

In order to increase the areal density of a disc it is necessary to create more bits on the surface area of the disc. Each bit consists of a plurality of grains, on the order of 10 to 100, that hold the magnetic state of each bit. Presently, grains are on the order of 10 to 20 nanometers in diameter, with advances demanding much smaller diameters. In order to increase areal density, it is necessary to either use fewer grains per bit or to decrease the size of the grains. It is undesirable to use fewer grains per bit because this increases the error and noise associated with each bit as there are fewer grains left to hold the magnetic orientation of the bit. Thus, it is necessary to decrease the size of the grains in each bit to increase areal density.

Decreasing the grain size has limitations. The switching energy of a grain is the energy required to switch the magnetic orientation of the grain along the easy axis.

$$E_B = K_U V (1 - H_{DC}/H_K)^2 \quad \text{Equation [1]}$$

The energy barrier, $E_B$, is a function of an anisotropy energy $K_U$ (which is the energy difference between the easy axis and hard axis orientation of the grain), grain volume V, the DC field strength $H_{DC}$, and anisotropy field strength $H_K$. Each grain also has an associated thermal energy, $k_B T$, that is the temperature dependent thermal energy of the grain, where $k_B$ is Boltzmann's constant and T is the absolute temperature. It is desirable that this only happen during write operations by the writer. Since the energy barrier is a function of grain volume V, with small grains the thermal energy can be greater than the energy barrier. This can result in undesired switching of the grain. Thus, the grains of magnetic media should not be so small that the thermal energy of the grain is greater than the energy barrier. In other words, the anisotropy energy $K_U V$ of each grain must remain higher than the thermal energy $k_B T$.

The grains comprising the magnetic media are not uniform in size. They are distributed over a range of grain volumes (or grain diameters). Ideally, all grains would be of the same size in order to ensure each grain is at the optimal volume to overcome thermal switching and maximize areal density. This, however, is not possible. Thus, it is necessary to have as narrow a distribution of grain volume (or diameter) as possible near the optimal grain volume (or diameter) in order to eliminate small grains that can be switched by thermal energy. Similarly, it is necessary to have a narrow $K_U$ distribution in order to insure that the grains are properly switching in a narrow range during the writing process by the writer, such that a narrow transition width will be achieved to support high recording density.

Media noise is dependent on grain size. Media noise is a result of "saw-toothed" transitions between bits on magnetic media. This means that one bit's region on the disc track is not clearly distinct from the next bit's region. These irregular boundaries result in noise as the reader transitions from one bit to the next. A low noise magnetic medium is accomplished by having small grain size. Smaller grain size helps average the arbitrary nature of the grains over more grains per bit, thus providing a smoother transition between bits. Decoupled grains also help to reduce media noise because the decoupled grains provide a more distinct transition between bits as clear grain boundaries are present in the micro-structure between uncoupled grains.

Direct measurement of grain size distribution $\sigma_V$ (or $\sigma_D$, where D is grain diameter) and anisotropy field distribution $\sigma_{HK}$ is crucial, as it enables key experimental insights into the main factors controlling these distributions and allows development of experimental materials and processing strategies to reduce them. In particular, as advances in magnetic recording move toward the use of thin film granular material, $\sigma_V$ and $\sigma_{HK}$ become even more important. Accurate determination of $\sigma_V$ and $\sigma_{HK}$, however, remains a challenge, especially in thin film decoupled granular material.

In thin film granular material, determination of grain size distribution and anisotropy field distribution is difficult. Magnetic measurements, such as susceptibility, are difficult in granular material since the magnetic signal generated by these grains is low. Also, thin films produce weaker signals because there is less material to produce a change in signal. Therefore, highly sensitive methods are needed.

Previously, both easy-axis and hard-axis hysteresis loops have been adopted to extract $\sigma_{HK}$. Papusoi et al., "Magnetic Anisotropy Field Dispersion Characterization of Advanced Perpendicular and Longitudinal Media," IEEE Transactions On Magnetics, Vol. 38, No. 4, July 2002, pp. 1687–1692. However, the extracted $\sigma_{HK}$ is convoluted with the crystalline anisotropy angular dispersion and the grain size dispersion.

Other techniques have used the temperature dependence of the complex transverse AC susceptibility (T. Jonsson, et. Al. *J. Magn. Magn. Mater.*, 168, 269 (1997)) or have used a Micro-SQUID noise technique (S. I Woods, et. al. *Phys. Rev. Lett.*, 87, 137205 (2001)) to measure energy barrier distributions in superparamagnetic nanoparticles. However, since both of these methods rely on measurements in the superparamagnetic state, they are of limited value in assessing dipsersions in thermally stable ferromagnetic media. This is because at temperatures near or above the Curie temperature needed to induce sufficient thermal fluctuations, the magnetic properties, spontaneous magnetization and anisotropy, and their dispersions are significantly different from respective values at the temperature of interest. Additionally, these methods do not allow for grain size distribution measurements.

In a recent paper in the theoretical field of susceptibility, which is herein incorporated by reference, Papusoi mathematically derive the relationship between the complex transverse AC Susceptibility with anisotropy field distribution, $\sigma_{HK}$, and grain size distribution, $\sigma_V$. Papusoi, "The Complex Transverse Susceptibility," Physics Letters A, Vol. 265, Issues 5–6, February 2000, pp. 391–402. Papusoi teaches that the measured complex transverse AC susceptibility contains information on both $\sigma_V$ and $\sigma_{HK}$. However, the separation of $\sigma_{HK}$ from $\sigma_V$ in the complex transverse AC susceptibility was not shown. Papusoi's calculations depend on the thermal relaxation rate of individual grains, as relied on in the above mentioned methods. Papusoi teaches that the thermal relaxation can be controlled by applying a DC field. Thus, susceptibility calculations can be carried out at the temperature of interest without altering the magnetic properties of the materials, namely spontaneous magnetization and anisotropy.

Papusoi suggests a pick-up coil detection scheme for measuring complex transverse AC susceptibility in recording tape. This method, however, is not accurate enough for use on thin film decoupled magnetic material. Specifically, the pick-up coil method suggested by Papusoi creates too much noise in the system at low levels to detect the small changes created by the reorientation of the individual grains. The pick-up coil method requires applying an AC field with a coil and a DC field to the magnetic sample material. The AC coil is present within the DC field, which causes the AC coil to vibrate. Thus, the detecting pick-up coil also vibrates when coupled with the AC coil. This causes noise greater than the susceptibility measurement in thin film granular material.

The pick-up coil method suggested by Papusoi also has another drawback when associated with measuring in magnetic recording media with a thin film top layer and a soft underlayer. The experiment Papusoi suggests uses a sample with a thickness of 200 nanometers. The area of interest in thin film magnetic recording media is the ultra-thin top and seed layers that have a thickness of ~20 nanometers. The pick-up coil method suggested by Papusoi will measure beyond the top and seed layers. The susceptibility measurement will then be an average of the whole sample, not just the top layers. Thus, the pick-up coil method is not able to obtain precise information from magnetic disc media with ultra-thin film top layers.

Thus, there is a need in the magnetic recording industry to accurately determine complex transverse susceptibility in ultra-thin film decoupled granular material so that $\sigma_V$ and $\sigma_{HK}$ can be accurately derived and de-convoluted.

BRIEF SUMMARY OF THE INVENTION

The present invention is a system and method for determining anisotropic field distribution and grain size distribution of ultra-thin film decoupled granular material. The invention utilizes a magneto-optical complex transverse AC susceptometer to measure susceptibility of thin film decoupled media. The present invention is able to measure in thin film decoupled granular material because of its high sensitivity. This method is also capable of measuring susceptibility of ultra-thin film top layers of magnetic recording media.

Specifically, the invention indirectly determines $\sigma_V$ and $\sigma_{HK}$ by first measuring transverse AC susceptibility as a function of an applied DC field, using the magneto-optical Kerr effect (MOKE). The complex components of the susceptibility are determined from the MOKE measurements. Values of $\sigma_V$ and $\sigma_{HK}$ are derived using curve fitting based on different sensitivities of imaginary susceptibility to $\sigma_V$ and $\sigma_{HK}$ at different DC field levels.

DETAILED DESCRIPTION OF THE PREFERRED EMBODIMENTS

Figure 1A:
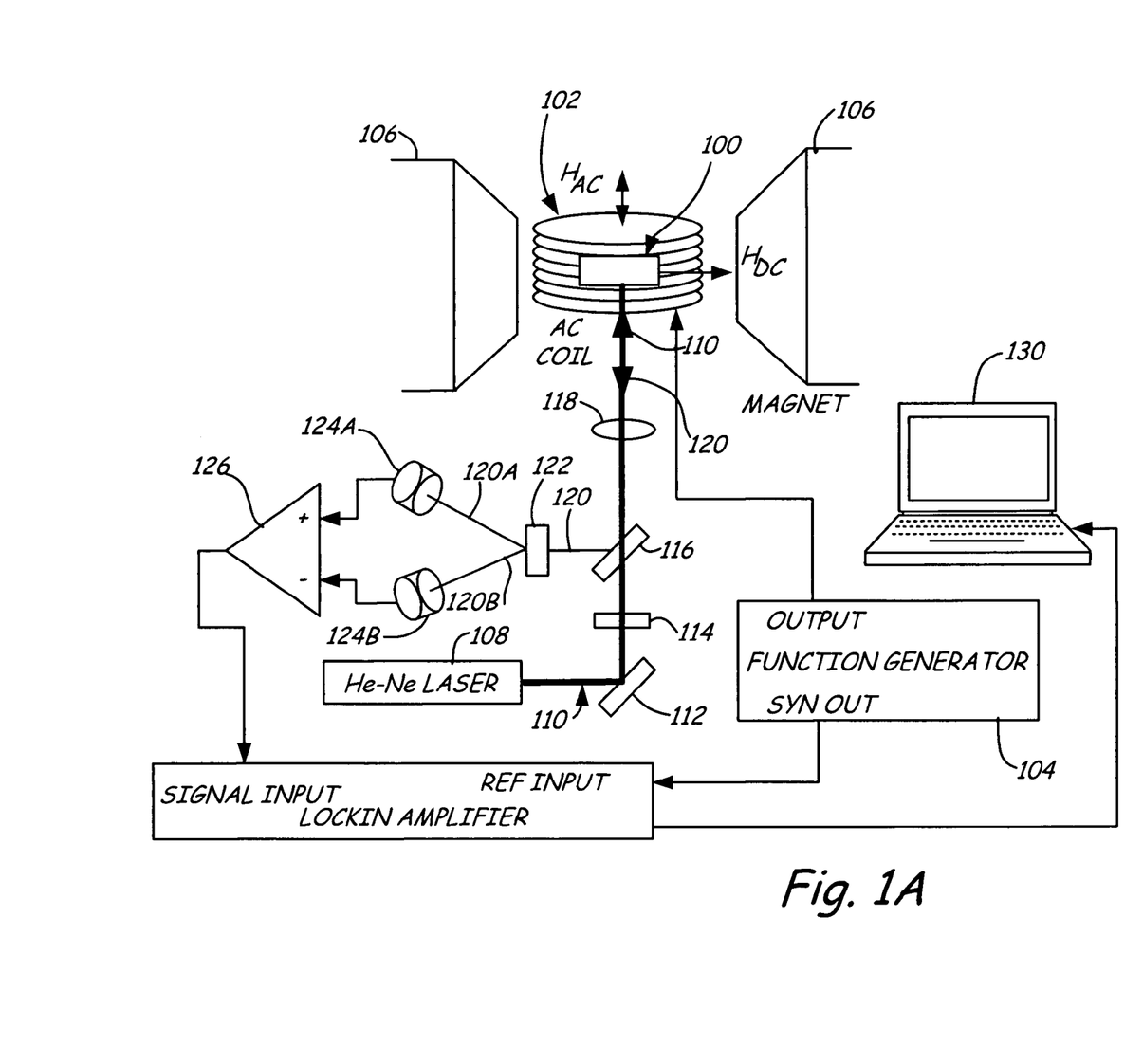
FIG. 1A illustrates a schematic layout of one embodiment of the complex AC magneto-optic susceptometer of the present invention for use with magnetic samples having perpendicular anisotropy.

FIG. 1A illustrates a schematic layout of one embodiment of the complex AC susceptometer of the present invention which uses the magneto-optic Kerr effect (MOKE) to derive values of $\sigma_V$ and $\sigma_{HK}$ from magnetic sample 100. In this embodiment, magnetic sample 100 is a decoupled granular magnetic thin film having perpendicular anisotropy—i.e. the easy axis of magnetization is perpendicular to the plane of magnetic sample 100. The MOKE complex AC suseptometer includes AC Helmholz coil 102, function generator 104, electromagnet 106, laser 108 (which produces incident beam 110), mirror 112, polarizer 114, beam splitter 116, lens 118, reflected beam 120, Wollostan prism (or analyzer) 122, photodiodes 124A and 124B, differential amplifier 126, lock-in amplifier 128, and computer 130.

In FIG. 1A, magnetic sample 100 is placed in an AC field, $H_{AC}$ and a DC field, $H_{DC}$. The DC field, $H_{DC}$, is in the plane of sample 100, while the AC field, $H_{AC}$, is perpendicular to the plane of sample 100. $H_{AC}$ is generated using AC Helmholtz coil 102 and function generator 104. $H_{DC}$ is generated using an electromagnet 106.

He—Ne laser 108 is the light source for the magneto-optical Kerr effect probe. Incident beam 110 from laser 108 is reflected by mirror 112, and passes through polarizer 114, beam splitter 116 and lens 118. Incident beam 110 is reflected at the surface of sample 100 and undergoes a polarization alteration due to the magnetization of sample 100. Reflected beam 120 passes through lens 118 and is reflected by beam splitter 116 to a detection arm that includes Wollaston prism 122 and photodiodes 124A and 124B. Wollaston prism 122, or analyzer, is used to separate polarized beam components 120A and 120B of reflected beam 120. Photodiodes 124A and 124B provide positive and negative input signals to differential amplifier 126. The output of differential amplifier 126 is a signal representing a difference in intensity of components 120A and 120B of reflected beam 120, which is proportional to the change of magnetization induced by the AC field. Lock-in amplifier 128, using as inputs a sync signal from function generator 104 and the output signal from differential amplifier 126, can determine the real and imaginary components of the susceptibility. Finally, computer 122 acquires the data and derives separate values for $\sigma_V$ and $\sigma_{HK}$ from the complex transverse AC susceptibility. This derivation is possible because of the high sensitivity of the MOKE measurements and the use of a variable DC field. The differing sensitivity of the imaginary component of AC susceptibility to $\sigma_V$ and $\sigma_{HK}$ at high and low DC fields allows computer HD to derive separate values by curve fitting.

Papusoi teaches that if the complex components of transverse AC susceptibility can be measured, convoluted information regarding the grain size, $\sigma_V$, and anisotropy field, $\sigma_{HK}$, distributions can be obtained, but does not disclose separating (deconvoluting) $\sigma_V$ and $\sigma_{HK}$. Details are disclosed in the Papusoi papers disclosed above, which are incorporated by reference. The equations essential to understanding the advances of the present invention are explained briefly below in order to better disclose the operation of the present invention.

In thin film granular recording media, data is represented by the magnetic orientation of a bit. In each bit there are a plurality of grains. The grains can be magnetically orientated in one of two ways along the easy axis of each grain. The magnetic orientation of the grains define the state of the bit. When data is written to a bit, the orientation of that bit is switched. In order to switch the bit, the energy barrier must be overcome. Normally, this is achieved by the writer of a disc drive system during write operations when the writer applies an external energy source to the bit.

Figure 1B:
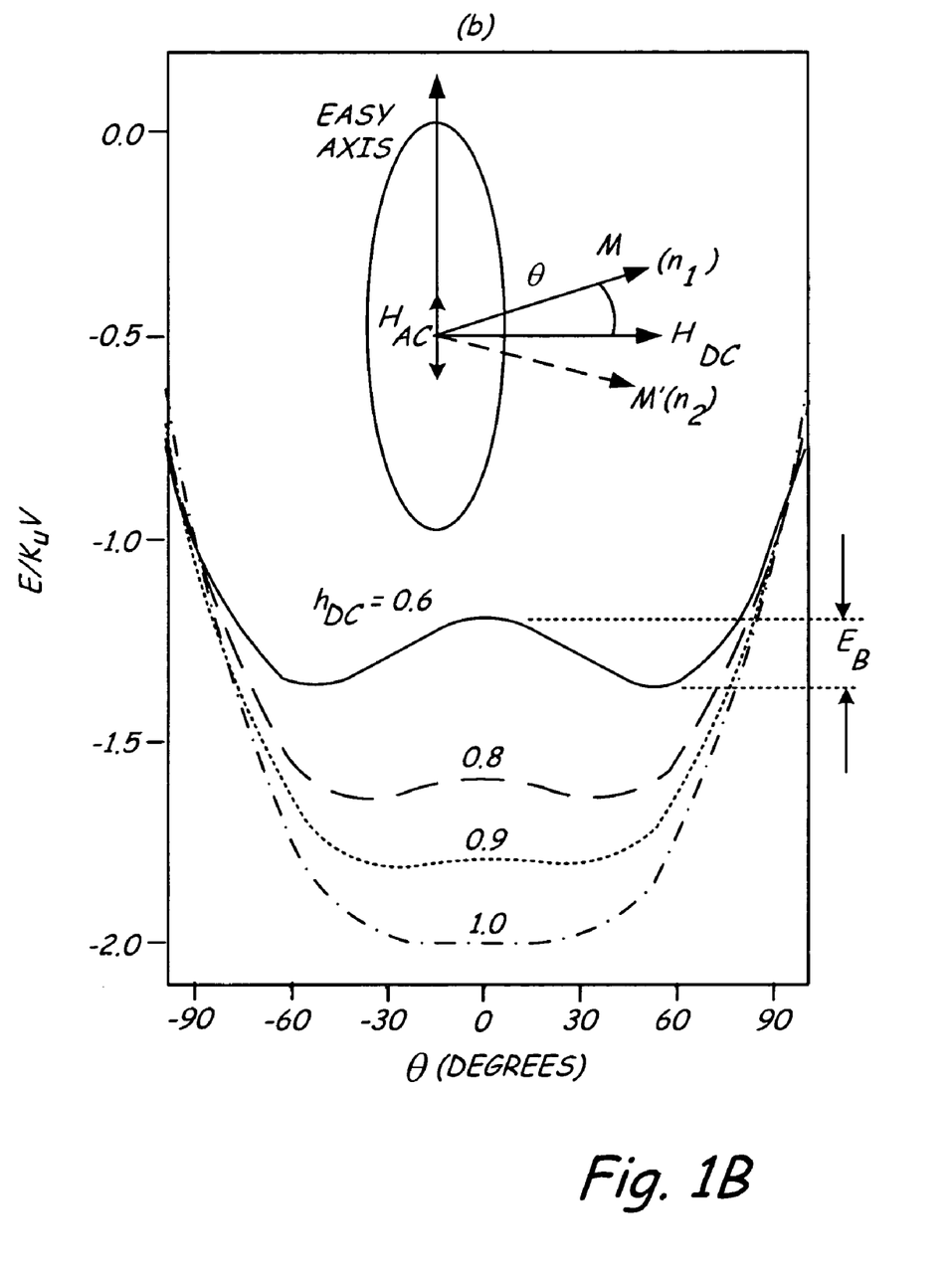
FIG 1B shows a plot of the energy barrier at various applied in-plane DC field strengths.

FIG. 1B shows a plot of the energy barrier at various applied in-plane DC field strengths. The insert to FIG. 1B shows a Stoner-Wohlfarth particle subject to two orthogonal fields: $H_{DC}$ and $H_{AC}$.

For a Stoner-Wohlfarth single domain perpendicular grain, when a DC field is applied along the hard-axis direction in the film plane, the energy barrier between two symmetric energy minima is represented by the following equation $$E_B = K_U V (1 - H_{DC}/H_K)^2 \qquad \text{Equation [1]}$$

where $K_U$ is the energy density, V is the grain volume, and $H_K = 2K_U/M_S$ is the anisotropy field (where $M_S$ is the saturation magnetization). As can be seen from the equation, the energy barrier is a function of the grain volume, V, and the DC field, $H_{DC}$.

As stated earlier, thermal energy can also cause the grains to switch orientation. The thermally activated switching rate, W, which represents the transition rate of the thermally activated reversal between two energy minima, is also a function of the DC field $H_{DC}$, the anisotropy $H_K$, the absolute temperature T, the Boltzman's constant $k_B$, the energy barrier $E_B$, the anisotropy energy $K_U$, and the thermal attempt frequency $f_0$.

$$W = f_0 \exp[-E_B/k_B T] \qquad \text{Equation [2]}$$

$$W = f_0 \exp[-K_U V/k_B T (1 - H_{DC}/H_K)^2] \qquad \text{Equation [3]}$$

Thus, the thermally activated switching rate, W, can be controlled by controlling the DC field applied to the sample material. As the DC field is increased, the lowered energy barrier enhances thermal relaxation process, leading to both real and imaginary components of transverse AC susceptibility as disclosed by Papusoi.

The real component corresponds to the reversible switching between the two energy minima, while the imaginary part is caused by irreversible switching. By analogy, the DC field plays a similar role with respect to the complex AC susceptibility measurements as the temperature. However, in conventional temperature dependent complex transverse AC-susceptibility, only the energy barrier distribution can be obtained.

In contrast, in the present invention, measurements are made over a range of DC field values. The field dependence of $\chi_T$ allows separation of $\sigma_{HK}$ and $\sigma_V$. For the complex susceptibility $\chi_T$, from the above energy barrier formula, the $H_K$ amplitude and the dispersion ($\sigma_{HK}$) affect both the thermal stability factor $K_U V/k_B T$ and the field modulation factor $(1 - H_{DC}/H_K)^2$, while the grain size dispersion ($\sigma_V$) or only affects the stability factor $K_U V/k_B T$. When the DC field is large, the field modulation factor dominates, hence the $\chi_T$ is more sensitive to the $H_K$ dispersion but less sensitive to the grain size dispersion. However, at small DC field, the contribution from the field modulation factor is small.

When an AC field is applied to the sample material along the easy axis direction, the energy barrier is modified to $$E_B = K_U V [(1 - h_{DC})^2 + 2h_{AC} \cos \theta_0] \qquad \text{Equation [4]}$$

where $K_U$ is the energy density, V is the grain volume, $h_{AC}$ is the DC field, $h_{DC}$ is the AC field, and $\theta$ is the angular frequency. The occupation probability $n_1(t)$ at the initial energy minimum can be calculated from the Arrhenius-Neel law: $dn_1(t)/dt = -P[2n_1(t) - 1] = -f_0 \exp[-E_B/k_B T][2n_1(t) - 1]$. Both real and imaginary parts of $\chi_T$ can be obtained accordingly. The real part is composed of thermal and non-thermal contributions. In addition, there is a singularity at $h_{DC} = 1$. The imaginary part is only due to thermal relaxation processes:

$$\text{Im}(\chi_T) = \frac{M_S}{H_K}\left(-4W\omega\beta \frac{1 - h_{DC}^2}{4W^2 + \omega^2}\right) \qquad \text{Equation [5]}$$

when $h_{DC} < 1$; and $$\text{Im}(\chi_T) = 0$$

when $h_{DC} \geq 1$;

where W is the thermally activated transition rate, $\beta = K_U V/k_B T$ and $\omega = 2\pi f_{AC}$. It is straightforward to show that $\text{Im}(\chi_T)$ peaks at $W = \omega/2$.

For thin film media with both grain size and anisotropy field distributions, the imaginary part is rewritten as $$\text{Im}(\chi_T) = \qquad \text{Equation [6]}$$

$$\frac{1}{V}\int_0^\infty \left[\int_0^\infty 4W\omega\beta \frac{1 - \left(\frac{h_{DC0}}{h_K}\right)^2}{4W^2 + \omega^2} VF(V)dV\right] \frac{G(h_k)}{h_K} dh_k$$

where V is the grain volume, W is the thermally activated switching rate, $\omega$ is the AC frequency, $\beta = K_U V/k_B T$, $G(h_k)$ is an assumed lognormal function of the anisotropy field distribution, F(V) is an assumed lognormal function of the grain size distribution, and $h_{DC0}$ is the DC field strength. Thus, we have an equation having as parameters the imaginary component of susceptibility, volume, anisotropy, the DC field, and the AC field. The imaginary component of the susceptibility can be measured and the values of the applied DC and AC fields are known. That leaves the two unknown parameters that are of interest, V and $H_K$, for which $\sigma_V$ and $\sigma_{HK}$ can be solved for with a fitting technique.

Returning to FIG. 1A, the invention can be more accurately described in light of the required measurements and calculations. Magnetic 100 is placed in a DC field, $H_{DC}$, such that $H_{DC}$ is in the plane of sample 100, and perpendicular to the easy axis of magnetization. Sample 100 is also positioned such that an AC field is applied perpendicular to the plane of sample 100 (and parallel to the easy axis). A 5 to 80 Oe AC field, $H_{AC}$, is generated using Helmholtz coil 102. The AC field, $H_{AC}$, is swept over a frequency range of 5 to 2500 Hz using a function generator 104. The DC field is swept over a +/-20 kOe range using electromagnet 106.

The DC field is applied to tune the relaxation rate such that the grains are switching on the same time scale of the applied AC field, which gives rise to large contribution to $\text{Im}(\chi_T)$. As the DC field is swept through a range of values, the energy barrier of certain grains will change according to Equation [4], and the portion of the grains contributing to $\text{Im}(\chi_T)$ depends strongly on the volume and anisotropy energy of each grain. This can be seen in Equation [5].

The transverse AC susceptibility of the sample material is measured using the magneto-optic Kerr effect. A small change of the perpendicular magnetization induced by the AC field is measured by the polar magneto-optical Kerr effect using the differential detector scheme shown in FIG. 1A. The transverse AC-susceptibility is defined as the ratio of the AC field induced perpendicular magnetization and the AC field strength. Susceptibility is defined as the ratio of the AC field induced perpendicular magnetization and the AC field strength. The MOKE probe of this invention is able to determine the complex parameters of AC susceptibility as a function of an applied DC field in thin film granular material.

The calibration of the measured Kerr angle against the magnetization was performed by static measurement of the Kerr angle as a function of the in-plane field after initially saturating the sample out of plane. This technique is further described in Ju et al., J. App. Phys., Vol. 93, No. 10, May 2003, pp. 7846–7848, herein incorporated by reference.

Incident beam 110 is reflected at the surface of sample 100. This is an important feature for determining susceptibility in thin film magnetic media. When determining the susceptibility of thin films, it is important to only measure the top layer and not have any influence of any underlying layers. The finite penetration depth and the high sensitivity of the magneto-optical Kerr effect are ideal to measure the transverse AC susceptibility of thin film magnetic media, even in the presence of a magnetic soft underlayer. The invention also achieves high sensitivity by eliminating excess noise from the measuring system. Laser 108 (the source of incident beam 110) is mechanically isolated from the applied DC and AC fields. This eliminates vibration from the system, which eliminates noise.

Both the real and imaginary parts of the transverse AC susceptibility are measured by lock-in amplifier 128, which uses phase sensitive lock-in detection to tune to the in-and out-of-phase components with the AC field. The susceptibility of sample 100 is recorded using computer 130 for a whole cycle of the applied AC field at each step in the DC field sweep. This gives rise to the three of the five variables in equation [5] at every DC field strength and AC frequency of interest. The remaining two variables, $\sigma_V$ and $\sigma_{HK}$, can be determined using a fitting technique, also done by the computer 130.

Figure 2A:
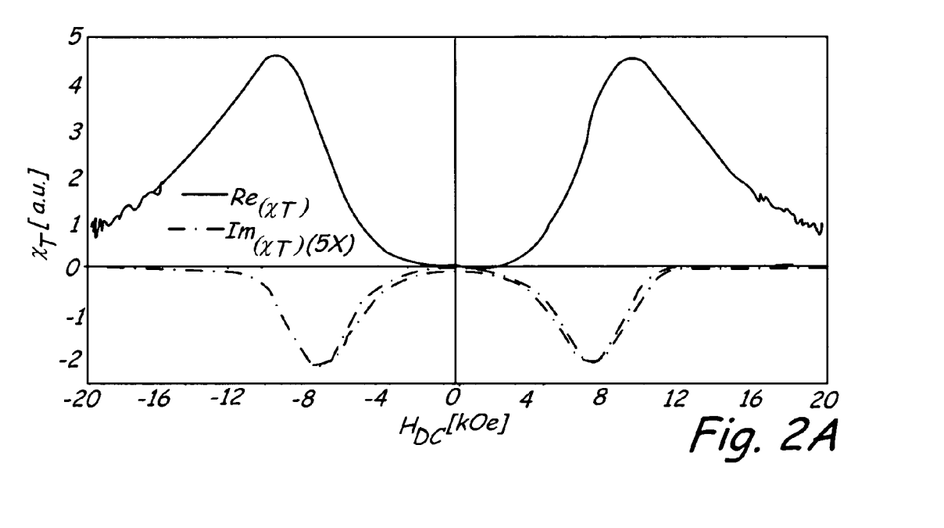
FIG. 2A shows a plot of the real and imaginary parts of the transverse susceptibility measured with the present invention.
Figure 2B:
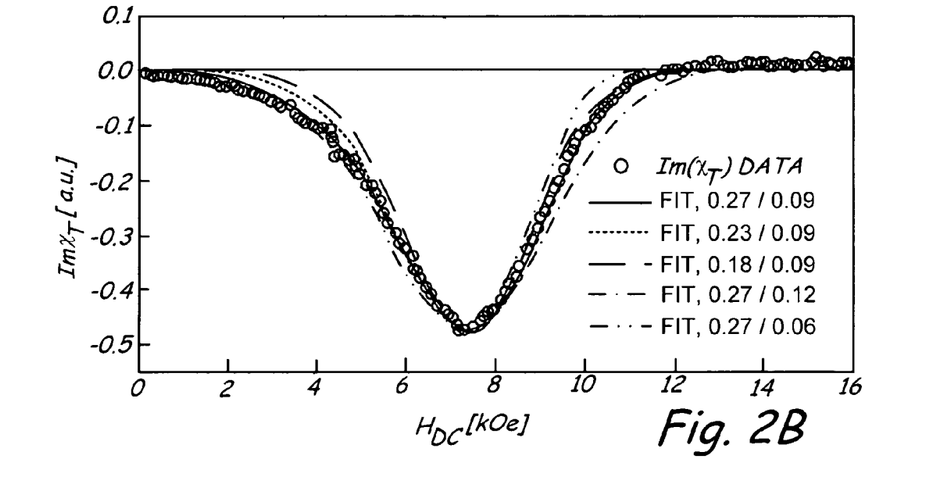
FIG. 2B shows a plot of the fitting of the volume distribution and anisotropy distribution from the imaginary part of the complex transverse susceptibility.

FIG. 2A and FIG. 2B show plots of the experimental measurements of the complex transverse susceptibility as measured by the magneto-optical Kerr effect. FIG. 2A shows the real and imaginary parts of the transverse susceptibility $\text{Re}(\chi_T)$ and $\text{Im}(\chi_T)$, at an AC field frequency of 500 Hz measured on a CoCrPt perpendicular alloy medium. FIG. 2B shows the fitting of the volume distribution and anisotropy distribution from the imaginary part of the complex transverse susceptibility. As shown in FIG. 2B, the $\text{Im}\chi_T$ data at fields smaller than about $H_{DC}$=7.5kOe (thenegative peak of $\text{Im}\chi_T$) are more sensitive to the grain size dispersion. The data at DC fields higher than 7.5kOe are more sensitive to the $H_K$ dispersion. Hence, both grain size and HK dispersions can be extracted by fitting the $(\chi_T)$ data, which yields a best fit with a $\sigma_D/\langle D\rangle$ of 0.27 and $\sigma_{HK}/\langle H_K\rangle$ of 0.09. The fitting is performed by first deriving a value of $\sigma_{HK}$ that best fits the higher DC field data. That value of $\sigma_{HK}$ is then used in deriving the value of $\sigma_V$ (or $\sigma_D$) that best fits the data at the lower DC field levels.

Figure 3A:
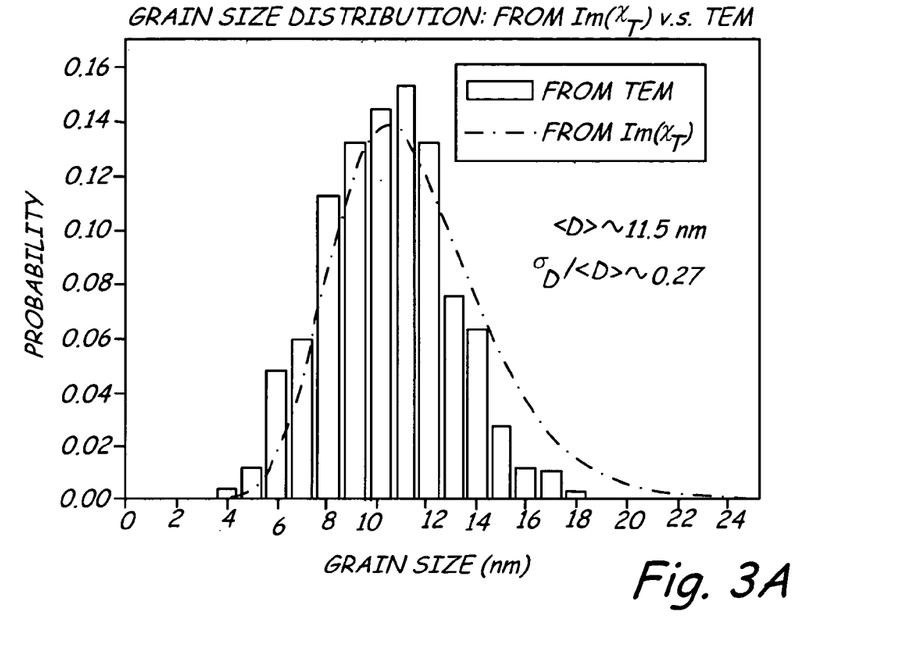
FIG. 3A shows a plot of a comparison between the grain size distributions obtained by this invention and by transmission electron microscopy (TEM).
Figure 3B:
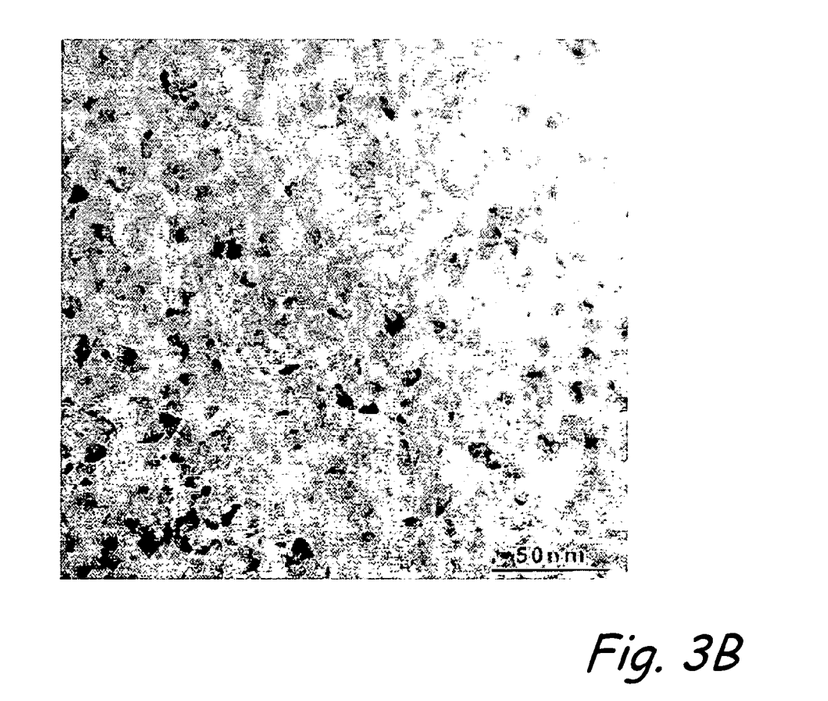
FIG. 3B is the TEM image used to obtain grain size distribution for comparison.

FIG. 3A shows a comparison between the grain size distribution measurements obtained by this invention and by TEM. Assuming a lognormal function for both distributions, a grain size dispersion of $\sigma_D/\langle D\rangle$=0.27 with the mean size $\langle D\rangle$=11.5 nm was found for the present alloy medium. The result agrees well with the grain size distribution, $\sigma_D/\langle D\rangle$=0.26, obtained from plane-view TEM grain size analysis. FIG. 3B is the TEM image used to obtain grain size distribution for comparison to the results of the present invention.

Figure 4:
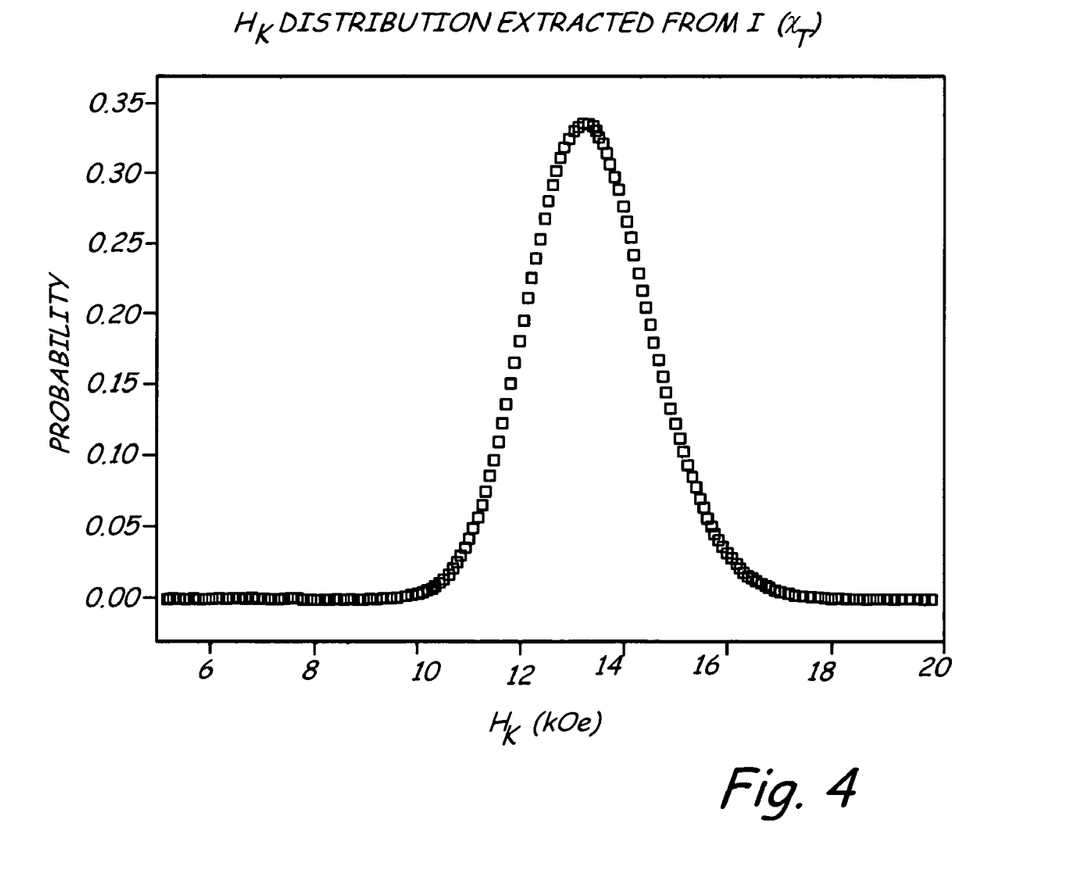
FIG. 4 shows a plot of the anisotropy distribution as obtained from the method of the present invention.

FIG. 4 shows a plot of the anisotropy distribution as obtained from the method of the present invention. A mean anisotropy $\langle H_K\rangle$=13.2kOe with a dispersion $\sigma_{HK}/\langle H_K\rangle$ was extracted.

Micromagnetic simulations indicate that the imaginary part of the transverse AC susceptibility is not very sensitive to angular dispersions and intergranular interactions, while the real part is much more sensitive to such effects. This is the primary reason that we use the imaginary susceptibility data to extract the distribution values in this invention. The method disclosed is valid for granular media with easy-axis distributions and intergranular interactions.

With the present invention, accurate measurements can be made to determine grain size distribution $\sigma_V$ and anisotropy field distribution $\sigma_{HK}$ in magnetic thin film granular material. This provides an important analytical tool needed in the continuing efforts to develop magnetic media capable of ever-increasing areal density.

Even though the invention has been described in use on media with perpendicular anisotropy, the measurement technique can also be applied for media with in-plane anisotropy. It can also be applied to sample formed by magnetic nanoparticles.

Figure 5:
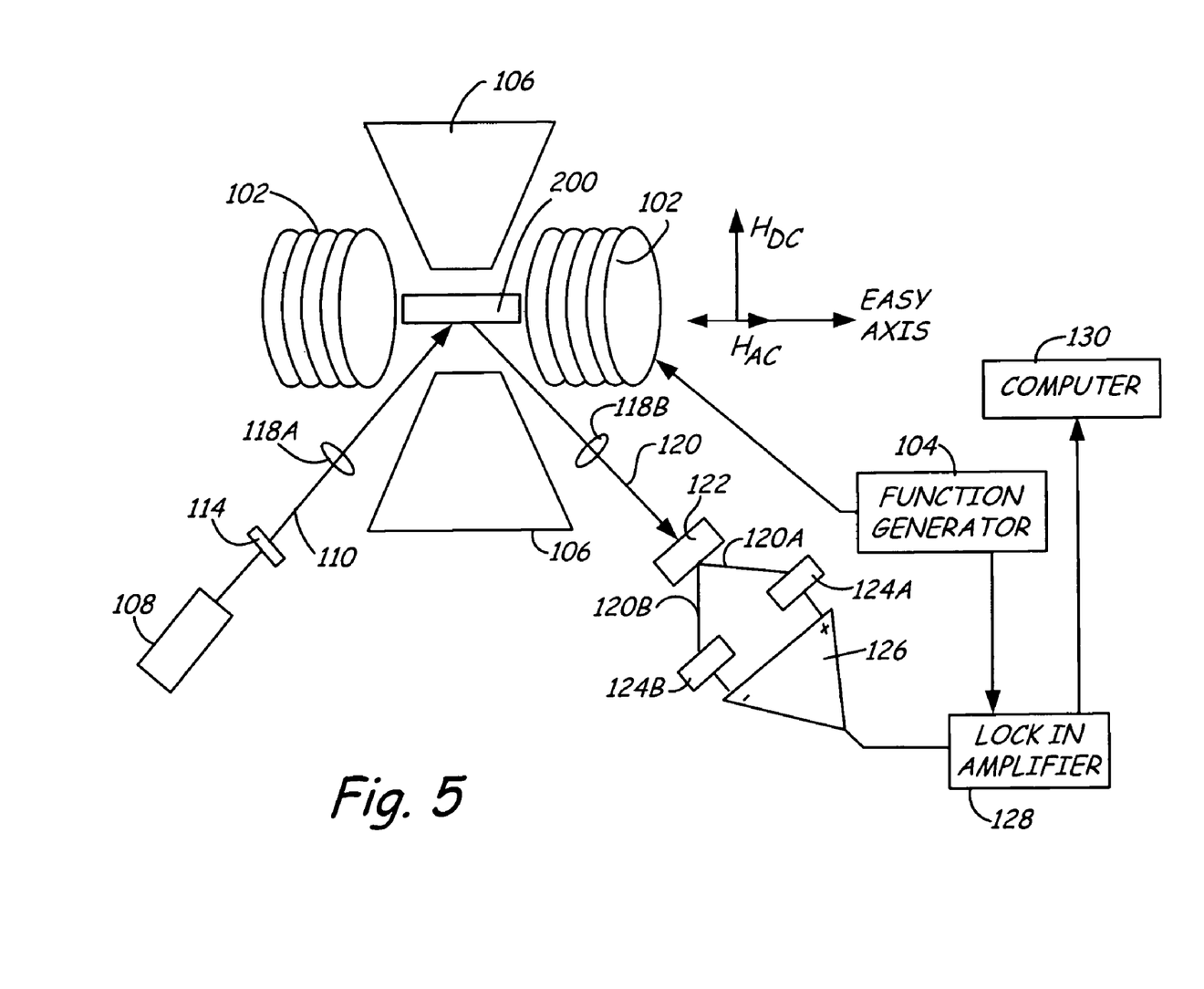
FIG. 5 shows a complex AC magneto-optic susceptometer of the present invention for use with magnetic samples having in-plane anisotropy.

FIG. 5 shows an embodiment of the system of the present invention used to determine anisotropy field distribution and volume distribution in magnetic sample 200, which has in-plane anisotropy (i.e. an easy axis in the plane of the sample). The system of FIG. 5 is generally similar to the system of FIG. 1A, and similar components have the same reference numeral. In FIG. 5, magnetic sample 200 is placed in an AC field, $H_{AC}$ parallel to the easy axis and a DC field, $H_{DC}$ perpendicular to the easy axis. $H_{AC}$ is generated using AC Helmholtz coil 102 and function generator 104. $H_{DC}$ is generated using an electromagnet 106, and is varied so that susceptibility measurements are made over a range of the $H_{DC}$ values.

Incident beam 110 from laser 108 passes through polarizer 114 and lens 118A and strikes the surface of sample 200. Incident beam 110 is reflected at the surface of sample 200 and undergoes a polarization alteration due to the magnetization of sample 200. Reflected beam 120 passes through lens 118B to a detection arm that includes Wollaston prism 122 and photodiodes 124A and 124B. Wollaston prism 122 separates polarized beam components 120A and 120B, which are detected by photodiodes 124A and 124B. The output of differential amplifier 126 is a signal representing the detected difference in intensity of components 120A and 120B, which is proportional to the change of magnetization induced by the AC field. Lock-in amplifier 128, using as inputs a sync signal from function generator 104 and the output signal from differential amplifier 126, determines the real and imaginary components of the susceptibility. Finally, a computer 122 acquires the data and derives separate values for $\sigma_V$ and $\sigma_{HK}$ from the complex transverse AC susceptibility as described above.

Although the present invention has been described with reference to preferred embodiments, workers skilled in the art will recognize that changes may be made in form and detail without departing from the spirit and scope of the invention.

The invention claimed is:

1. A method for determining anisotropy field distribution and volume distribution of a magnetic sample, the method comprising:
    applying a DC magnetic field to the sample in a first direction perpendicular to an easy axis of magnetization of the sample;
    applying an AC magnetic field to the sample in a second direction parallel to the easy axis of magnetization of the sample;
    measuring a magneto-optic Kerr effect exhibited by the sample to produce a time-varying measurement signal;
    separating real and imaginary components of the measurement signal; and
    deriving anisotropy field distribution and volume distribution values based upon the real and imaginary components and magnitudes of the AC and DC fields.

2. The method of claim 1 wherein the DC field is swept over a range of field strengths.

3. The method of claim 1 wherein the DC field is generated using an electromagnet.

4. The method of claim 1 wherein the AC field is controlled using a function generator.

5. The method of claim 1 wherein the AC field is generated using a Helmholtz coil.

6. The method of claim 1 wherein the real and imaginary components are separated from the measurement signal using a lock-in amplifier.

7. The method of claim 1 wherein deriving the anisotropy field distribution and volume distribution values is carried out by a computer.

8. The method of claim 1 wherein the magnetic sample is a granular thin film.

9. The method of claim 1 wherein the magnetic sample comprises magnetic nanoparticles.

10. The method of claim 1 wherein the easy axis of magnetization is perpendicular to a plane of the magnetic sample.

11. The method of claim 1 wherein the easy axis of magnetization lies in a plane of the magnetic sample.

12. The method of claim 1 wherein deriving the anisotropy field distribution and volume distribution values includes separately determining the anisotropy field distribution value and the volume distribution values based upon an differing sensitivity of an imaginary part of transverse AC susceptibility at different magnitudes of the DC magnetic field.

13. A system for determining anisotropy field distribution and volume distribution in a magnetic sample, the system comprising:
    means for applying a DC magnetic field over a range of field strengths to the sample in a direction perpendicular to an easy axis of magnetization of the sample;
    means for applying an AC magnetic field to the sample in a direction parallel to the easy axis of magnetization of the sample;
    means for measuring a magneto-optic Kerr effect exhibited by the sample to produce a time-varying measurement signal;
    means for separating real and imaginary components of the measurement signal; and
    means for deriving separate anisotropy field distribution and volume distribution values based upon differing sensitivity of the imaginary component of the measurement signal to anisotropy field and volume distributions at different DC field strengths.

14. The system of claim 13 wherein the means for applying a DC field comprises an electromagnet.

15. The system of claim 13 wherein the means for applying an AC magnetic field includes an AC coil and a function generator that provides an AC drive signal to the AC coil.

16. The system of claim 13 wherein the means for separating the real and imaginary components from the measurement signal comprises a lock-in amplifier.

17. The system of claim 16 wherein the lock-in amplifier separates the real and imaginary components based upon the measurement signal and a signal from the means for applying an AC magnetic field.

18. The system of claim 13 wherein the means for deriving the anisotropy field distribution values and volume distribution values comprises a computer.

19. The system of claim 13 wherein the magnetic sample is a granular thin film.

20. The system of claim 13 wherein the magnetic sample comprises magnetic nanoparticles.

21. The system of claim 13 wherein the easy axis of magnetization is perpendicular to a plane of the magnetic sample.

22. The system of claim 13 wherein the easy axis of magnetization lies in a plane of the magnetic sample.

23. A method of determining anisotropy field distribution and volume distribution of a magnetic sample, the method comprising:
    measuring AC transverse susceptibility of the magnetic sample by detecting a magneto-optic Kerr effect exhibited by the magnetic sample while an AC magnetic field is applied to the magnetic sample in a direction parallel to an easy axis of magnetization of the magnetic sample, and a DC magnetic field is applied over a range of field strengths to the magnetic sample in a direction perpendicular to the easy axis; and
    deriving separate values of anisotropy field distribution and volume distribution based upon a relationship of an imaginary component of AC transverse susceptibility to different DC field strengths.

24. A system for determining anisotropy field distribution and volume distribution in a magnetic sample, the system comprising:
an electromagnet for applying a DC magnetic field over a range of field strengths to the sample in a direction perpendicular to an easy axis of magnetization of the sample;
an AC coil for applying an AC magnetic field to the sample in a direction parallel to the easy axis of magnetization of the sample;
a magneto-optic probe for measuring a magneto-optic Kerr effect exhibited by the sample to produce a time-varying measurement signal;
signal processing circuitry for separating real and imaginary components of the measurement signal; and
a computer for deriving separate anisotropy field distribution and volume distribution values based upon differing sensitivity of the imaginary component of the measurement signal to anisotropy field and volume distributions at different DC field strengths.

25. The system of claim 24 and further comprising:
function generator that provides an AC drive signal to the AC coil.

26. The system of claim 25 wherein the signal processing circuitry includes a lock-in amplifier.

27. The system of claim 26 wherein the lock-in amplifier separates the real and imaginary components based upon the measurement signal and a signal from the function generator.

28. The system of claim 24 wherein the magnetic sample is a granular thin film.

29. The system of claim 24 wherein the magnetic sample comprises magnetic nanoparticles.

30. The system of claim 24 wherein the easy axis of magnetization is perpendicular to a plane of the magnetic sample.

31. The system of claim 24 wherein the easy axis of magnetization lies in a plane of the magnetic sample.

32. The method of claim 1 wherein the step of measuring a magneto-optic Kerr effect exhibited by the sample measures a magneto-optic Kerr effect in an ultra-thin top layer of the sample.

33. The method of claim 1 wherein the step of measuring a magneto-optic Kerr effect exhibited by the sample further comprises mechanically isolating a laser source of a magneto-optic probe from sources of the AC and DC magnetic fields.

34. The method of claim 1 wherein the step of measuring a magneto-optic Kerr effect exhibited by the sample to produce a time-varying measurement signal produces a signal distinct from interference from underlying soft magnetic layers and system noise.

35. The method of claim 1 wherein the step of deriving the anisotropy field distribution and volume distribution is carried out using a fitting technique.

36. The method of claim 35 wherein the fitting technique comprises:
fitting a first curve to the imaginary component of the measurement signal at a first portion to derive the anisotropy field distribution values; and
fitting a second curve to the imaginary component of the measurement signal at a second portion to derive the volume distribution values.

37. The system of claim 24 wherein the magneto-optic probe measures the magneto-optic Kerr effect exhibited by an ultra-thin top layer of the sample.

38. The system of claim 24 wherein the magneto-optic probe comprises a laser source mechanically isolated from the electromagnet and AC coil.

39. The system of claim 24 wherein the magneto-optic probe produces a signal distinct from interference from underlying soft magnetic layers and system noise.

40. The system of claim 24 wherein the computer for deriving separate anisotropy field distribution and volume distribution values performs a fitting technique to derive the anisotropy field and distribution and volume distribution values.

41. The system of claim 40 wherein the fitting technique comprises:
fitting a first curve to the imaginary component of the measurement signal at a first portion to derive the anisotropy field distribution values; and
fitting a second curve to the imaginary component of the measurement signal at a second portion to derive the volume distribution values.

42. A method for determining anisotropy field distribution and volume distribution of a magnetic sample, the method comprising:
measuring an imaginary component of complex transverse AC susceptibility of the magnetic sample over a range of DC field strengths; and
deriving separate values of anisotropy field distribution and volume distribution by fitting a curve of a susceptibility equation to the measured imaginary component of complex transverse AC susceptibility at DC field strengths where the imaginary component of complex transverse AC susceptibility is differently sensitive to anisotropy field distribution and volume distribution.

43. The method of claim 42 wherein the deriving step further comprises:
plotting the measured imaginary component of complex transverse AC susceptibility versus the range of DC field strengths;
fitting a first curve governed by the susceptibility equation to the plotted measured imaginary component of complex transverse AC susceptibility at higher DC field strengths to obtain the anisotropy field distribution; and
fitting a second curve governed by the susceptibility equation to the plotted measured imaginary component of complex transverse AC susceptibility at lower DC field strengths to obtain the volume distribution.

44. The method of claim 43 wherein the fitting technique further comprises utilizing the obtained anisotropy field distribution to obtain the volume distribution.

45. The method of claim 42 wherein the step of measuring the imaginary component complex of transverse AC susceptibility comprises:
mechanically isolating a magneto-optic Kerr effect probe from other system components to obtain the imaginary component of transverse AC susceptibility with reduced noise; and
measuring the imaginary component of transverse AC susceptibility in an ultra-thin film top layer of the sample to obtain susceptibility measurements with reduced influence from underlying layers.

46. A system for determining anisotropy field distribution and volume distribution in a magnetic sample, the system comprising:
a DC field source and an AC field source for inducing switching of grain orientation in the magnetic sample;

a magneto-optic Kerr effect probe for measuring an imaginary component of complex transverse AC susceptibility in an ultra-thin top layer of the magnetic sample based upon the induced switching; and a computer system for solving susceptibility equations with a fitting technique to deriving separate anisotropy field distribution and volume distribution values based upon differing relationships of the imaginary component of complex transverse AC susceptibility to the anisotropy field distribution and volume distribution, parameters of the DC and AC field sources, and the measured imaginary component of transverse AC susceptibility.

47. The system of claim 46 wherein the differing relationships of the imaginary component of complex transverse AC susceptibility to the anisotropy field distribution and volume distribution comprises:

heightened sensitivity of the imaginary component of complex transverse AC susceptibility to volume at low DC field strengths; and heightened sensitivity of the imaginary component of complex transverse AC susceptibility to anisotropy field at high DC field strengths.

48. The system of claim 46 wherein the fitting technique comprises:

plotting the imaginary component of complex transverse AC susceptibility versus the range of DC field strengths;

fitting a first curve governed by an equation representing the imaginary component of complex transverse AC susceptibility to the plotted imaginary component of complex transverse AC susceptibility at higher DC field strengths to obtain the anisotropy field distribution; and fitting a second curve governed by the equation representing the imaginary component of complex transverse AC susceptibility to the plotted imaginary component of complex transverse AC susceptibility at lower DC field strengths to obtain the volume distribution.

49. The of claim 46 wherein the magneto-optic Kerr effect probe comprises a laser mechanically isolated from the DC field source and the AC field source such that noise from the DC field source and AC field source in the measured imaginary component of complex transverse AC susceptibility is reduced.

* * * * *

UNITED STATES PATENT AND TRADEMARK OFFICE
CERTIFICATE OF CORRECTION

PATENT NO. : 7,166,997 B2 Page 1 of 1
APPLICATION NO. : 10/679905
DATED : January 23, 2007
INVENTOR(S) : Ganping Ju et al.

It is certified that error appears in the above-identified patent and that said Letters Patent is hereby corrected as shown below:

Column 1 of Page 2 under Other Publications, Line 7,
delete "asab/AC$_{13}$", insert --asab/AC_--

Signed and Sealed this

Twenty-sixth Day of February, 2008

JON W. DUDAS
*Director of the United States Patent and Trademark Office*